US011967977B2

(12) United States Patent
Beppu

(10) Patent No.: US 11,967,977 B2
(45) Date of Patent: Apr. 23, 2024

(54) SWITCH CIRCUIT, RADIO FREQUENCY FRONT-END CIRCUIT, AND COMMUNICATION DEVICE

(71) Applicant: Murata Manufacturing Co., Ltd., Kyoto (JP)

(72) Inventor: Nobuyasu Beppu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 925 days.

(21) Appl. No.: 16/991,231

(22) Filed: Aug. 12, 2020

(65) Prior Publication Data

US 2020/0373947 A1    Nov. 26, 2020

Related U.S. Application Data

(63) Continuation of application No. PCT/JP2019/003479, filed on Jan. 31, 2019.

(30) Foreign Application Priority Data

Feb. 15, 2018 (JP) .................. 2018-024866

(51) Int. Cl.
*H03F 3/19* (2006.01)
*H03K 17/687* (2006.01)
*H04B 1/00* (2006.01)

(52) U.S. Cl.
CPC .............. *H04B 1/006* (2013.01); *H03F 3/19* (2013.01); *H03K 17/687* (2013.01); *H03F 2200/451* (2013.01)

(58) Field of Classification Search
CPC .................. H03F 3/19; H03F 2200/451; H03F 2200/111; H03F 2203/7209; H03F 3/245;
(Continued)

(56) References Cited

U.S. PATENT DOCUMENTS 5,731,607 A * 3/1998 Kohama ............ H03K 17/6874
257/275
2006/0145779 A1   7/2006 Furuta

FOREIGN PATENT DOCUMENTS

JP    H105299995 A    11/1993
JP    H11186890 A     7/1999
(Continued)

OTHER PUBLICATIONS

International Search Report issued in Application No. PCT/JP2019/003479, dated Apr. 23, 2019.
(Continued)

*Primary Examiner* — Andrea Lindgren Baltzell
*Assistant Examiner* — Khiem D Nguyen
(74) *Attorney, Agent, or Firm* — Pearne & Gordon LLP

(57) ABSTRACT

A switch circuit (10) includes: a transistor ($T_1$) switching the conductivity state between a drain terminal (D1) and a source terminal (S1) between being conductive and non-conductive; a transistor ($T_2$) switching the conductivity state between a drain terminal (D2) and a source terminal (S2) between being conductive and non-conductive, the source terminals (S1) and (S2) being connected to a node (N1) and an input/output terminal (120), respectively, and the drain terminals (D1) and (D2) being connected to an input/output terminal (110) and the node (N1) respectively; a transistor ($T_3$) switching the conductivity state between a drain terminal (D3) and a source terminal (S3) between being conductive and non-conductive, the drain terminal (D3) and the source terminal (S3) being arranged along a second path connecting the node (N1) and ground; and a capacitor ($C_1$) placed in the second path and connected in series to the transistor ($T_3$).

9 Claims, 7 Drawing Sheets

(58) Field of Classification Search
CPC ........ H03F 3/72; H04B 1/006; H03K 17/687; H03K 17/063; H03K 2017/066; H03K 17/693
USPC .................................................. 330/295, 51
See application file for complete search history.

(56) References Cited

FOREIGN PATENT DOCUMENTS

| | | |
|---|---|---|
| JP | 2004072362 A | 3/2004 |
| JP | 2005303794 A | 10/2005 |
| JP | 2007019696 A | 1/2007 |
| JP | 2007214825 A | 8/2007 |
| JP | 2010147589 A | 7/2010 |

OTHER PUBLICATIONS

Written Opinion issued in Application No. PCT/JP2019/003479, dated Apr. 23, 2019.

\* cited by examiner

FIG. 6A
FIG. 6B
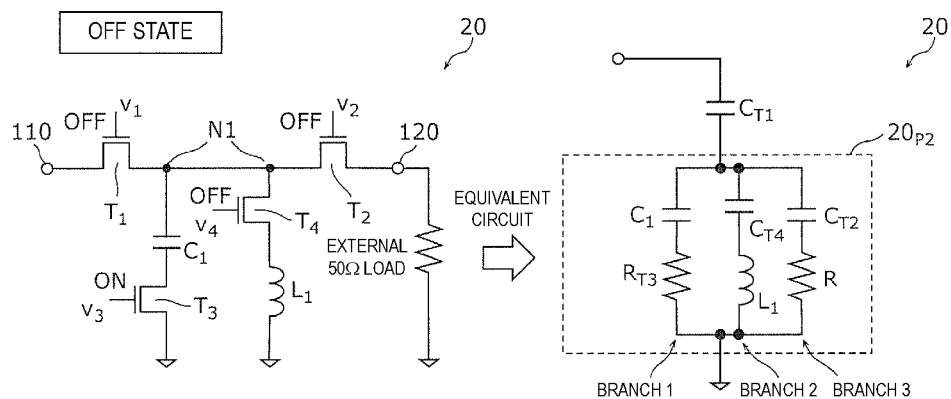
FIG. 6C
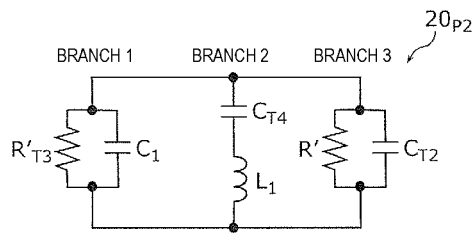
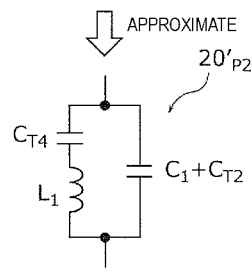
FIG. 6D
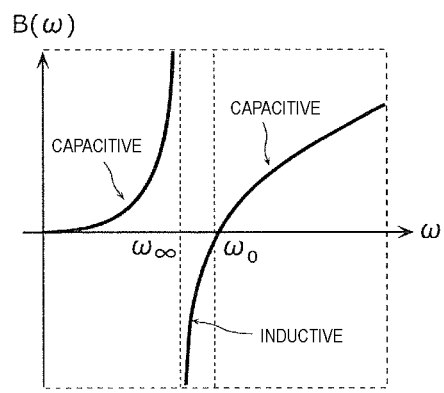

SWITCH CIRCUIT, RADIO FREQUENCY FRONT-END CIRCUIT, AND COMMUNICATION DEVICE

This is a continuation of International Application No. PCT/JP2019/003479 filed on Jan. 31, 2019 which claims priority from Japanese Patent Application No. 2018-024866 filed on Feb. 15, 2018. The contents of these applications are incorporated herein by reference in their entireties.

BACKGROUND OF THE DISCLOSURE

Field of the Disclosure

The present disclosure relates to switch circuits, radio frequency front-end circuits, and communication devices.

Description of the Related Art

In recent years, multiband communication systems are being employed, in which a plurality of communication bands is used for transmitting and receiving. In such communication systems, a front-end switch circuit is required to switch signal transmission paths for respective communication bands in response to a mode in which a radio frequency signal of one of the plurality of communication bands is transmitted and received and a mode in which radio frequency signals of two of the plurality of communication bands are simultaneously transmitted and received. This front-end switch circuit is formed by combining single pole single throw (SPST) type switch circuits each switching the conductivity state between two nodes between being conductive and non-conductive.

Patent document 1 discloses a semiconductor switch integrated circuit. Specifically, the semiconductor switch integrated circuit (switch circuit) is made up of two series FETs arranged between two nodes and a shunt FET connected to a connection node of these two series FETs. By switching between the connection state where the two series FETs are in the ON state and the shunt FET is in the OFF state and the connection state where the two series FETs are in the OFF state and the shunt FET is in the ON state, the presence or absence of signal supply to a path beyond the switch can be controlled.

Patent Document 1: Japanese Unexamined Patent Application Publication No. 11-186890

BRIEF SUMMARY OF THE DISCLOSURE

However, in cases where the switch circuit disclosed in Patent document 1 is applied to, for example, a front-end switch circuit of a mobile communication device, there may be a case in which, for example, the switch circuit transmits a high-power, high-voltage radio frequency signal amplified in an amplifier. In such case, the breakdown voltage of each of FETs that constitute the switch circuit becomes an issue. Further, in order to increase the breakdown voltage, it is conceivable to configure each FET in such a manner as to have a structure in which a plurality of unit FETs is stacked on top of each other (connected in series). However, in such case, the ON resistance of FET increases, and the insertion loss of the switch circuit increases.

Accordingly, the present disclosure is made to resolve the foregoing issues, and an object thereof is to provide a switch circuit, a radio frequency front-end circuit, and a communication device, each with improved breakdown voltage capability while maintaining low loss property.

In order to achieve the foregoing object, a switch circuit according to one aspect of the present disclosure includes: a first input/output terminal to which a radio frequency load is connected; a second input/output terminal to which a radio frequency load is connected; a first transistor including a first terminal, a second terminal, and a first control terminal, the first terminal being connected to the first input/output terminal, the second terminal being connected to a first node on a first path connecting the first input/output terminal and the second input/output terminal, the first transistor switching a continuity state between the first terminal and the second terminal between being conductive and non-conductive based on a first control signal supplied to the first control terminal; a second transistor including a third terminal, a fourth terminal, and a second control terminal, the fourth terminal being connected to the second input/output terminal, the third terminal being connected to the first node, the second transistor switching a continuity state between the third terminal and the fourth terminal between being conductive and non-conductive, in synchronization with the first transistor; a third transistor including a fifth terminal, a sixth terminal, and a third control terminal, the fifth terminal and the sixth terminal being arranged along a second path connecting the first node and ground, the third transistor switching a continuity state between the fifth terminal and the sixth terminal between being conductive and non-conductive, mutually exclusively with the first transistor and the second transistor; and a capacitive element placed in the second path, the capacitive element being connected in series to the third transistor.

According to this, (1) when the first transistor and the second transistor are in the conductive state and the third transistor is in the non-conductive state, for example, the voltage of a radio frequency signal applied from the first input/output terminal is applied across the first node and the ground. However, this applied voltage is divided between the third transistor and the capacitive element. Therefore, compared with a prior art switch circuit in which a capacitive element is not placed, the voltage applied to the third transistor can be reduced. Further, (2) when the first transistor and the second transistor are in the non-conductive state and the third transistor is in the conductive state, for example, the voltage of a radio frequency signal applied from the first input/output terminal is divided among the first transistor, the second transistor, and the capacitive element. In this case, because the capacitive element is placed, the potential of the first node is not equal to the ground potential and is closer to the potential of the first input/output terminal than the ground potential. Therefore, the voltage applied across two terminals of the first transistor and the voltage applied across two terminals of the second transistor each become a voltage smaller than the radio frequency signal voltage, and thus the voltage applied to the first transistor can be reduced. Similarly, for example, when a radio frequency signal voltage is applied from the second input/output terminal, the voltage applied across two terminals of the second transistor and the voltage applied across two terminals of the first transistor each become a voltage smaller than the radio frequency signal voltage, and thus the voltage applied to the second transistor can be reduced.

That is to say, without changing the circuit configuration along the first path, the voltages applied to the first transistor, the second transistor, and the third transistor can be reduced. This enables to improve the breakdown voltage capability of a switch circuit without compromising the low loss property of the switch circuit.

The switch circuit may further include: a fourth transistor including a seventh terminal, an eighth terminal, and a fourth control terminal, the seventh terminal and the eighth terminal being arranged along a third path connecting the first node and the ground, the third path being different from the second path, the fourth transistor switching a continuity state between the seventh terminal and the eighth terminal between being conductive and non-conductive, in synchronization with the first transistor and the second transistor; and an inductive element placed in the third path, the inductive element being connected in series to the fourth transistor.

According to this, (1) when the first transistor and the second transistor are in the conductive state and the third transistor is in the non-conductive state, the fourth transistor becomes conductive, and the capacitive element, the third transistor in the non-conductive state (OFF capacitance), and the inductive element constitute a parallel resonant circuit. At this time, in the vicinity of a resonant frequency of the parallel resonant circuit, the impedance of the parallel resonant circuit reaches a local maximum, and this enables to minimize the loss caused by parasitic capacitance existing between a transmission path and the ground. This then enables to maximize the power transmission efficiency for the radio frequency load connected to the second input/output terminal. On the other hand, (2) when the first transistor and the second transistor are in the non-conductive state and the third transistor is in the conductive state, the fourth transistor becomes non-conductive. In this case, the inductive element is connected in series to the fourth transistor in the non-conductive state (OFF capacitance), and this enables to make a circuit network capacitive, the circuit network being a circuit network in which a series connection circuit of the third transistor in the conductive state (ON resistance) and the capacitive element, a series connection circuit of the fourth transistor in the non-conductive state (OFF capacitance) and the inductive element, and a series connection circuit of the second transistor in the non-conductive state (OFF capacitance) and the foregoing radio frequency load are connected in parallel. Therefore, it becomes possible to avoid the case where the voltage of the first node becomes greater than the radio frequency signal voltage. Accordingly, the breakdown voltage capability of the switch circuit in the non-conductive state can be improved while reducing the insertion loss of the switch circuit in the conductive state.

Further, when the first transistor, the second transistor, and the fourth transistor are in the non-conductive state and the third transistor is in the conductive state, a reactance may have a negative value when a circuit is viewed from the first node, the circuit being a circuit in which (1) a series connection circuit of the capacitive element and the third transistor, (2) a series connection circuit of the fourth transistor and the inductive element, and (3) a series connection circuit of the second transistor and the radio frequency load connected to the second input/output terminal are connected in parallel.

According of this, it becomes possible to avoid the case where the voltage of the first node becomes greater than the radio frequency signal voltage. Accordingly, the breakdown voltage capability of the switch circuit in the non-conductive state can be improved.

Further, an OFF capacitance $C_{T4}$ of the fourth transistor may have a value that satisfies a relationship expressed by Math. 1:

[Math. 1]

$$\frac{1}{2\pi\sqrt{L_1 C_{T4}}} \geq 10 \cdot f_S$$

where $L_1$ is inductance of the inductive element, $C_{T4}$ is the OFF capacitance of the fourth transistor, and $f_S$ is a use frequency of a radio frequency signal to be transmitted through the switch circuit.

According of this, the frequency range where the foregoing circuit network becomes inductive is a radio frequency range whose frequencies are equal to or more than ten times the use frequency $f_S$ of the switch circuit. Therefore, in the use frequency $f_S$, the foregoing circuit network can maintain the capacitive property, and this enables to avoid the case where the voltage of the first node becomes a voltage greater than the radio frequency signal voltage. Accordingly, it becomes possible to effectively improve the breakdown voltage capability of the switch circuit at the use frequency $f_S$.

Further, the first input/output terminal, the second input/output terminal, the first transistor, the second transistor, the third transistor, the fourth transistor, the capacitive element, and the inductive element may be formed in a single switch IC.

This facilitates the mounting of the switch circuit on a mounting substrate or the like. Further, this enables to shorten wiring lines inside the switch circuit, thereby reducing the transmission loss caused by the wiring lines.

Further, the first input/output terminal, the second input/output terminal, the first transistor, the second transistor, the third transistor, the fourth transistor, and the capacitive element may be formed in a single switch IC, and the inductive element may be formed outside the switch IC.

According to this, the inductive element can be changed depending on impedance matching with a radio frequency element connected to the switch circuit, the number of signal paths connected to the switch circuit, and the like, thereby improving flexibility in designing the switch circuit.

Further, the switch circuit may include a common terminal, a first selection terminal, a second selection terminal, a first switch unit including any one of the switch circuits described above, and a second switch unit including any one of the switch circuits described above, wherein the common terminal is the first input/output terminal of the first switch unit and is the first input/output terminal of the second switch unit, the first selection terminal is the second input/output terminal of the first switch unit, and the second selection terminal is the second input/output terminal of the second switch unit.

According to this, it becomes possible to provide a single pole double throw (SPDT) type switch circuit with improved breakdown voltage capability while maintaining the low loss property.

Further, the switch circuit may include: a first common terminal and a second common terminal; a first selection terminal and a second selection terminal; a first switch unit including any one of the switch circuits described above; a second switch unit including any one of the switch circuits described above; a third switch unit including any one of the switch circuits described above; and a fourth switch unit including any one of the switch circuits described above; wherein the first common terminal is the first input/output terminal of the first switch unit and is the first input/output terminal of the second switch unit, the second common terminal is the first input/output terminal of the third switch unit and is the first input/output terminal of the fourth switch unit, the first selection terminal is the second input/output terminal of the first switch unit and is the second input/output terminal of the third switch unit, and the second selection terminal is the second input/output terminal of the second switch unit and is the second input/output terminal of the fourth switch unit.

According to this, it becomes possible to provide a double pole double throw (DPDT) type switch circuit with improved breakdown voltage capability while maintaining the low loss property.

Further, a radio frequency front-end circuit according to one aspect of the present disclosure includes: one of the switch circuits described above; a plurality of filters connected to the one of the switch circuits; and a plurality of amplifier circuits respectively connected to the plurality of filters.

According to this, it becomes possible to provide the radio frequency front-end circuit with improved breakdown voltage capability while maintaining the low loss property.

Further, a communication device according to one aspect of the present disclosure includes: an RF signal processing circuit that performs processing on a radio frequency signal being transmitted or received by an antenna element; and the radio frequency front-end circuit described above, which transmits a radio frequency signal between the antenna element and the RF signal processing circuit.

According to this, it becomes possible to provide the communication device with improved breakdown voltage capability while maintaining the low loss property.

The present disclosure enables to provide a switch circuit, a radio frequency front-end circuit, and a communication device, each with improved breakdown voltage capability while maintaining the low loss property.

BRIEF DESCRIPTION OF THE SEVERAL VIEWS OF THE DRAWINGS

FIGS. 6A and 6B illustrate equivalent circuit diagrams of the switch circuit according to Embodiment 2 in the non-conductive state.

FIG. 6C is an equivalent circuit diagram of a LC parallel resonant circuit in the switch circuit according to Embodiment 2.

FIG. 6D is a graph illustrating the frequency dependency of susceptance of the LC parallel resonant circuit in the switch circuit according to Embodiment 2.

DETAILED DESCRIPTION OF THE DISCLOSURE

Figure 1:
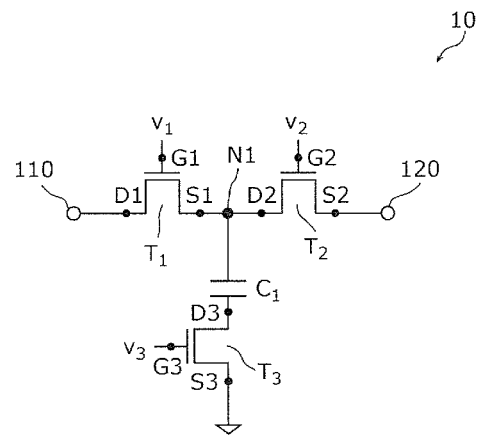
FIG. 1 is a circuit configuration diagram of a switch circuit according to Embodiment 1.

Hereinafter, embodiments of the present disclosure will be described in detail using embodiments and the drawings thereof. Note that embodiments, which will be described below, each illustrate a comprehensive or specific example. Numeric values, shapes, materials, constituting elements, arrangements, and connection modes of the constituting elements, and the like illustrated in the following embodiments are mere examples, and not intended to limit the present disclosure. Of constituting elements in the following embodiments, the constituting elements that are not described in an independent claim will be described as optional constituting elements. Further, dimensions or ratios of dimensions of constituting elements illustrated in the drawings are not necessarily be precise.

Embodiment 1

1.1 Configuration of Switch Circuit According to Embodiment 1

FIG. 1 is a circuit configuration diagram of a switch circuit 10 according to Embodiment 1. As illustrated in FIG. 1, the switch circuit 10 includes input/output terminals 110 and 120, transistors $T_1$, $T_2$, and $T_3$, and a capacitor $C_1$.

As will be described below in Embodiment 4, for example, the switch circuit 10 is a switch circuit to be placed in a front-end unit of a multi-band communication system (communication device), and radio frequency loads such as an antenna element, a filter, an amplifier, a RF signal processing circuit (RFIC), and the like are connected to the input/output terminals 110 and 120.

The transistor $T_1$ is a n-type field effect transistor (FET) including a drain terminal D1 (first terminal), a source terminal S1 (second terminal), and a gate terminal G1 (first control terminal). The drain terminal D1 is connected to the input/output terminal 110, and the source terminal S1 is connected to a node N1 (first node) on a first path connecting the input/output terminal 110 and the input/output terminal 120. The transistor $T_1$ is a first transistor that switches the conductivity state between the drain terminal D1 and the source terminal S1 between being conductive and non-conductive based on a control signal $v_1$ (first control signal) supplied to the gate terminal G1.

The transistor $T_2$ is a n-type FET including a drain terminal D2 (third terminal), a source terminal S2 (fourth terminal), and a gate terminal G2 (second control terminal). The source terminal S2 is connected to the input/output terminal 120, and the drain terminal D2 is connected to the node N1. The transistor $T_2$ is a second transistor that switches, in synchronization with the transistor $T_1$, the conductivity state between the drain terminal D2 and the source terminal S2 between being conductive and non-conductive based on a control signal $v_2$ supplied to the gate terminal G2. That is to say, when the transistor $T_1$ is in the conductive state, the transistor $T_2$ is in the conductive state, and when the transistor $T_1$ is in the non-conductive state, the transistor $T_2$ is in the non-conductive state.

The transistor $T_3$ is a n-type FET including a drain terminal D3 (fifth terminal), a source terminal S3 (sixth terminal), and a gate terminal G3 (third control terminal). The drain terminal D3 and the source terminal S3 are arranged along a second path connecting the node N1 and ground. The transistor $T_3$ is a third transistor that switches, mutually exclusively with the transistors $T_1$ and $T_2$, the conductivity state between the drain terminal D3 and the source terminal S3 between being conductive and non-conductive based on a control signal $v_3$ supplied to the gate terminal G3. That is to say, when the transistors $T_1$ and $T_2$ are in the conductive state, the transistor $T_3$ is in the non-conductive state, and when the transistors $T_1$ and $T_2$ are in the non-conductive state, the transistor $T_3$ is in the conductive state.

Note that the control signals $v_1$, $v_2$, and $v_3$ are outputted from, for example, a control circuit included in a RFIC or a switch IC, which will be described below.

Note that the transistors $T_1$, $T_2$, and $T_3$ may not necessarily be n-type FETs and may alternatively be p-type FETs. Further, the transistors $T_1$, $T_2$, and $T_3$ may not necessarily be FETs and may be bi-polar transistors.

The capacitor $C_1$ is a capacitive element that is placed in the second path and connected in series to the transistor $T_3$. In the present embodiment, the capacitor $C_1$ is placed between the node N1 and the transistor $T_3$. The capacitor $C_1$ may alternatively be placed between the transistor $T_3$ and the ground.

According to the foregoing configuration, (1) when the transistors $T_1$ and $T_2$ are in the conductive state and the transistor $T_3$ is in the non-conductive state, the switch circuit 10 becomes conductive and outputs a radio frequency signal, which is inputted to the input/output terminal 110, to the input/output terminal 120 with low loss via the first path. On the other hand, (2) when the transistors $T_1$ and $T_2$ are in the non-conductive state and the transistor $T_3$ is in the conductive state, the switch circuit 10 becomes non-conductive, and a radio frequency signal inputted to the input/output terminal 110 is blocked at the first path. At this time, because the transistor $T_3$ is in the conductive state and the capacitor $C_1$ is in the conductive state at radio frequencies, leaking of a radio frequency signal, which is inputted to the input/output terminal 110, into the input/output terminal 120 can be suppressed with a high degree of accuracy.

Note that the switch circuit 10 according to the present embodiment can also receive a radio frequency signal inputted to the input/output terminal 120 and output the radio frequency signal from the input/output terminal 110. That is to say, the switch circuit 10 according to the present embodiment has the configuration that enables a radio frequency signal to be transmitted bi-directionally between the input/output terminal 110 and the input/output terminal 120.

1.2 Switch Circuit According to Comparative Example 1

Figure 2A:
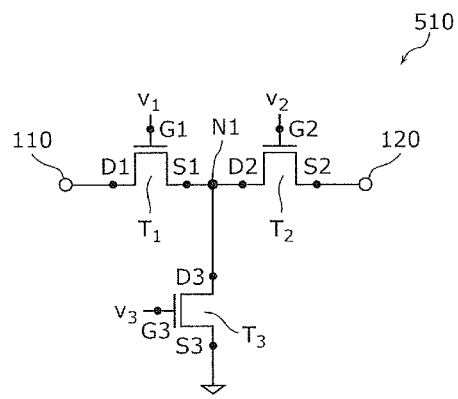
FIG. 2A is a circuit configuration diagram of a switch circuit according to Comparative example 1.

FIG. 2A is a circuit configuration diagram of a switch circuit 510 according to Comparative example 1. The switch circuit 510 illustrated in FIG. 2A is a prior art switch circuit and includes input/output terminals 110 and 120 and transistors $T_1$, $T_2$, and $T_3$. In terms of the circuit configuration, the switch circuit 510 according to Comparative example 1 is different from the switch circuit 10 according to Embodiment 1 in including no capacitive element. In the following, the switch circuit 510 according to Comparative example 1 is described with the emphasis on the points different from the switch circuit 10 according to Embodiment 1 while omitting the description regarding the common point.

The transistor $T_1$ is a n-type FET including a drain terminal D1, a source terminal S1, and a gate terminal G1. The drain terminal D1 is connected to the input/output terminal 110, and the source terminal S1 is connected to the node N1.

The transistor $T_2$ is a n-type FET including a drain terminal D2, a source terminal S2, and a gate terminal G2. The source terminal S2 is connected to the input/output terminal 120, and the drain terminal D2 is connected to the node N1. The transistor $T_2$ switches, in synchronization with the transistor $T_1$, the conductivity state between the drain terminal D2 and the source terminal S2 between being conductive and non-conductive.

The transistor $T_3$ is a n-type FET including a drain terminal D3, a source terminal S3, and a gate terminal G3. The drain terminal D3 is connected to the node N1, and the source terminal S3 is connected to the ground. The transistor $T_3$ switches, mutually exclusively with the transistors $T_1$ and $T_2$, the conductivity state between the drain terminal D3 and the source terminal S3 between being conductive and non-conductive.

Figure 2B:
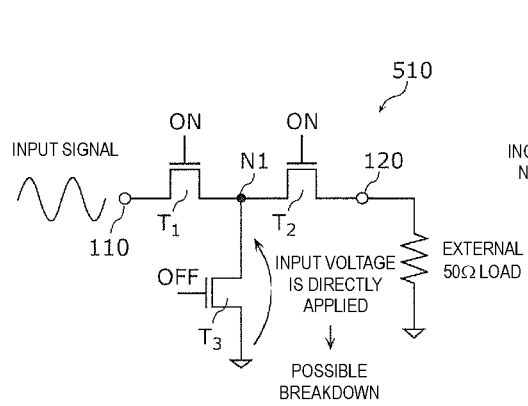
FIGS. 2B and 2C are circuit diagrams of switch circuits according to Comparative example 1 and Comparative example 2 in the conductive state.
Figure 2C:
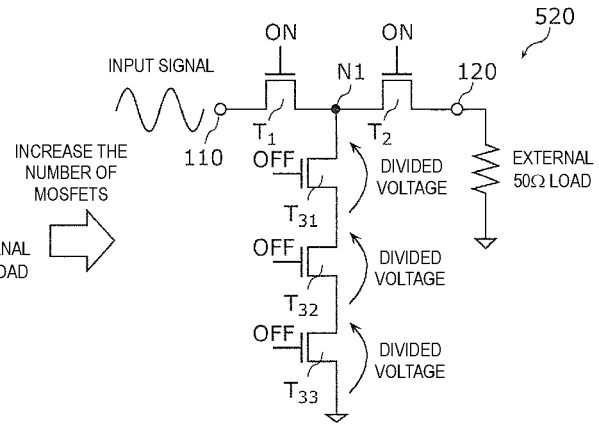

FIGS. 2B and 2C are circuit diagrams of switch circuits according to Comparative example 1 and Comparative example 2 in the conductive state. FIG. 2B illustrates a circuit diagram of the switch circuit 510 according to Comparative example 1 in the conductive state. Here, when the transistors $T_1$ and $T_2$ are in the conductive state and the transistor $T_3$ is in the non-conductive state, the voltage of a radio frequency signal applied from the input/output terminal 110 is applied across the node N1 and the ground. At this time, this applied voltage is applied across two end portions of the transistor $T_3$ in the non-conductive state. That is to say, the entire voltage of a radio frequency signal inputted to the switch circuit 510 is applied to the transistor $T_3$. Therefore, in the case where the switch circuit 510 is applied to a front-end circuit that handles a high-power radio frequency signal, the risk of breakdown of the transistor $T_3$ increases due to the input radio frequency signal.

Whereas, FIG. 2C illustrates a circuit diagram of a switch circuit 520 according to Comparative example 2 in the conductive state. The switch circuit 520 according to Comparative example 2 is obtained by modifying the switch circuit 510 according to Comparative example 1 in such a manner as to replace the transistor $T_3$ with a circuit in which a plurality of transistors $T_{31}$ to $T_{33}$ are connected in series. Note that transistors used in an ordinary switch circuit each have a structure in which a plurality of unit FETs (unit transistors) are stacked on top of each other (cascade connection) in order to increase the breakdown voltage of the transistor, as is the case with Comparative example 2. This allows the voltage of an input radio frequency signal to be applied in a distributed manner to a plurality of transistors $T_{31}$ to $T_{33}$ in the switch circuit 520 according to Comparative example 2. Accordingly, in the case where characteristics of the transistors $T_{31}$, $T_{32}$, and $T_{33}$ are substantially the same, the voltage to be applied to each of the transistors $T_{31}$ to $T_{33}$ can be reduced to ⅓, and the risk of breakdown of the transistors $T_{31}$ to $T_{33}$ can be reduced. However, at the time when the transistors $T_{31}$ to $T_{33}$ are in the conductive state, the ON resistance increases in proportion to the number of the transistors, and this degrades switching characteristics such as insertion loss, isolation, and the like. Further, because the number of the transistors increases, the size of the switch circuit increases.

1.3 Functions and Effects of Switch Circuit According to Embodiment 1

Compared with the switch circuits according to Comparative example 1 and Comparative example 2 described above, the switch circuit 10 according to the present embodiment has the following functions and effects.

Figure 3A:
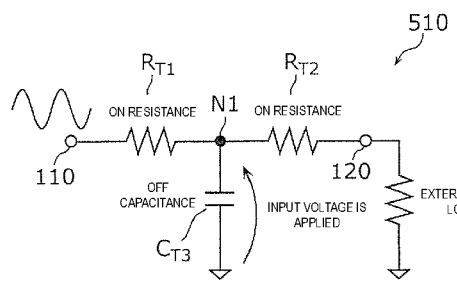
FIGS. 3A and 3B are equivalent circuit diagrams of the switch circuits according to Comparative example 1 and Embodiment 1 in the conductive state.
Figure 3B:
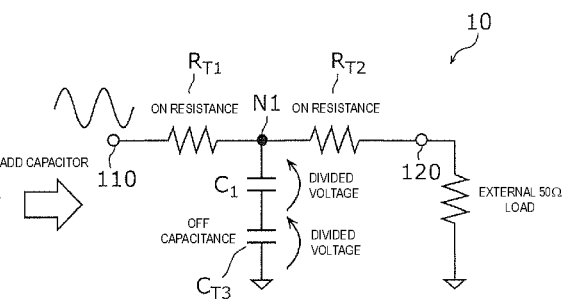

FIGS. 3A and 3B are equivalent circuit diagrams of the switch circuits according to Comparative example 1 and Embodiment 1 in the conductive state. FIG. 3A illustrates an equivalent circuit of the switch circuit 510 according to Comparative example 1 in the conductive state. The switch circuit 510 in the conductive state is represented by an ON resistance $R_{T1}$ of the transistor $T_1$ in the conductive state, an ON resistance $R_{T2}$ of the transistor $T_2$ in the conductive state, and an OFF capacitance $C_{T3}$ of the transistor $T_3$ in the non-conductive state. At this time, the entire voltage of a radio frequency signal inputted to the switch circuit 510 is applied to the OFF capacitance $C_{T3}$.

Whereas, FIG. 3B illustrates an equivalent circuit of the switch circuit 10 according to Embodiment 1 in the conductive state. The switch circuit 10 is represented by the ON resistance $R_{T1}$ of the transistor $T_1$ in the conductive state, the ON resistance $R_{T2}$ of the transistor $T_2$ in the conductive state, the OFF capacitance $C_{T3}$ of the transistor $T_3$ in the non-conductive state, and the capacitor $C_1$. In this case, although the voltage of a radio frequency signal inputted to the switch circuit 10 is applied across the node N1 and the ground, this applied voltage is divided between the OFF capacitance $C_{T3}$ and the capacitor $C_1$. That is to say, the voltage applied to the transistor $T_3$ in the OFF state is reduced compared with that of the prior art switch circuit 510 in which no capacitive element is placed.

Figure 3C:
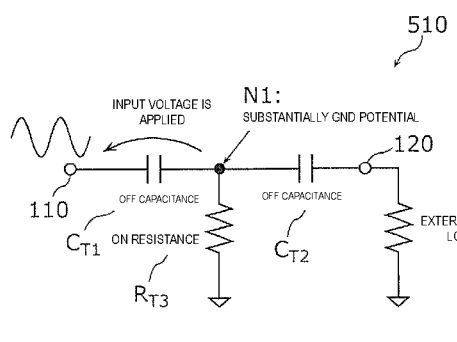
FIGS. 3C and 3D are equivalent circuit diagrams of the switch circuits according to Comparative example 1 and Embodiment 1 in the non-conductive state.
Figure 3D:
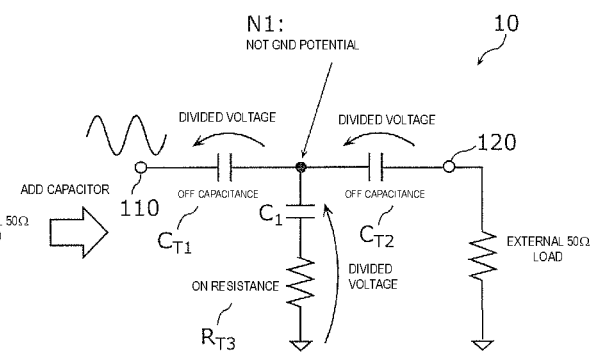

FIGS. 3C and 3D are equivalent circuit diagrams of the switch circuits according to Comparative example 1 and Embodiment 1 in the non-conductive state. FIG. 3C illustrates an equivalent circuit of the switch circuit 510 according to Comparative example 1 in the non-conductive state. The switch circuit 510 in the non-conductive state is represented by an OFF capacitance $C_{T1}$ of the transistor $T_1$ in the non-conductive state, an OFF capacitance $C_{T2}$ of the transistor $T_2$ in the non-conductive state, and an ON resistance $R_{T3}$ of the transistor $T_3$ in the conductive state. At this time, because the node N1 is substantially at a ground potential, the entire voltage of a radio frequency signal inputted to the switch circuit 510 is applied across two end portions of the OFF capacitance $C_{T1}$. In this case, in the case where the switch circuit 510 is applied to a front-end circuit that handles a high-power radio frequency signal, the risk of breakdown of the transistor $T_1$ increases due to the input radio frequency signal.

Whereas, FIG. 3D illustrates an equivalent circuit of the switch circuit 10 according to Embodiment 1 in the non-conductive state. The switch circuit 10 is represented by the OFF capacitance $C_{T1}$ of the transistor $T_1$ in the non-conductive state, the OFF capacitance $C_{T2}$ of the transistor $T_2$ in the non-conductive state, the ON resistance $R_{T3}$ of the transistor $T_3$ in the conductive state, and the capacitor $C_1$. In this case, the voltage of a radio frequency signal inputted to the switch circuit 10 is divided among the OFF capacitance $C_{T1}$, the OFF capacitance $C_{T2}$, and the capacitor $C_1$. In this case, because of the placement of the capacitor $C_1$, the potential of the node N1 is not equal to the ground potential and becomes closer to the potential of the input/output terminal 110 than the ground potential. Therefore, the voltage applied across two terminals of the transistor $T_1$ and the voltage applied across two terminals of the transistor $T_2$ each become a voltage smaller than the radio frequency signal voltage, and thus compared with that of the prior art switch circuit 510 in which no capacitive element is placed, the voltage applied to the transistor $T_1$ can be reduced.

That is to say, as illustrated in FIG. 3B and FIG. 3D, the switch circuit 10 according to the present embodiment enables to improve the breakdown voltage capability of the switch circuit 10 without compromising the low loss property of the switch circuit 10 because the voltage to be applied to each of the transistors $T_1$ to $T_3$ can be reduced without changing the circuit configuration along the first path compared with the switch circuit 510 according to Comparative example 1.

Further, in the case where each of the transistors $T_1$, $T_2$, and $T_3$, which constitute the switch circuit 10 according to the present embodiment, has a structure in which a plurality of unit FETs (unit transistors) are stacked on top of each other (cascade connection) as is the case with Comparative example 2, the voltage to be applied to each of the transistors $T_1$ to $T_3$ can be reduced as described above. This enables the switch circuit 10 according to the present embodiment to reduce the number of stacks of the transistors $T_1$ to $T_3$ (the number of series-connected stages) compared with the switch circuits according to Comparative example 1 and Comparative example 2. That is to say, compared with the switch circuits according to Comparative example 1 and Comparative example 2, the switch circuit 10 according to the present embodiment enables to modify the circuit configurations along the first path and the second path (specifically, reduce the number of stacks of the transistors) by additionally inserting the capacitor $C_1$ in the second path. This enables to (1) reduce the ON resistance of each transistor, and thus the insertion loss of switch circuit 10 can be reduced. Further, this enables to (2) reduce the number of stacks of each transistor, and thus the size of the switch circuit 10 can be reduced.

Embodiment 2

In the present embodiment, the configuration of a switch circuit 20 is described. Compared with the switch circuit 10 according to Embodiment 1, in the switch circuit 20, impedance matching with a radio frequency load, low loss property, and breakdown voltage capability of the switch circuit 20 are further improved.

2.1 Configuration of Switch Circuit According to Embodiment 2

Figure 4:
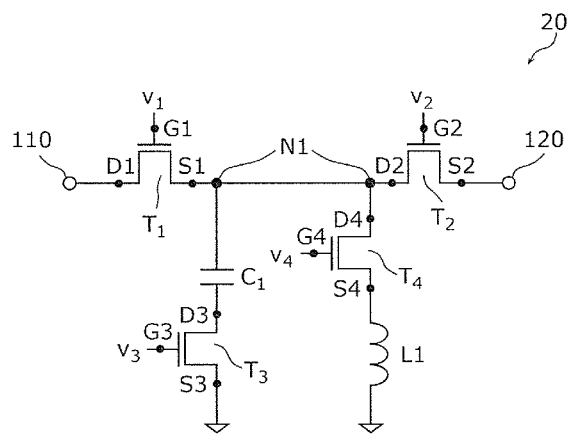
FIG. 4 is a circuit configuration diagram of a switch circuit according to Embodiment 2.

FIG. 4 is a circuit configuration diagram of the switch circuit 20 according to Embodiment 2. As illustrated in FIG. 4, the switch circuit 20 includes input/output terminals 110 and 120, transistors $T_2$, $T_2$, $T_3$, and $T_4$, a capacitor $C_1$, and an inductor $L_1$. In terms of the circuit configuration, the switch circuit 20 according to the present embodiment is different from the switch circuit 10 according to Embodiment 1 in having an additional series connection circuit of the transistor $T_4$ and the inductor $L_1$. In the following, the switch circuit 20 according to the present embodiment is described with the emphasis on the points different from the switch circuit 10 according to Embodiment 1 while omitting the description regarding the common point.

As will be described below in Embodiment 4, for example, the switch circuit 20 is a switch circuit to be placed in a front-end unit of a multi-band communication system (communication device), and radio frequency loads such as an antenna element, a filter, an amplifier, a RF signal processing circuit (RFIC), and the like are connected to the input/output terminals 110 and 120.

The transistor $T_4$ is a n-type FET including a drain terminal D4 (seventh terminal), a source terminal S4 (eighth terminal), and a gate terminal G4 (fourth control terminal). The drain terminal D4 and the source terminal S4 are arranged along a third path connecting the node N1 and ground. Note that the third path is a path connecting the node N1 and the ground and is different from the second path along which the capacitor $C_1$ and the transistor $T_3$ are arranged. The transistor $T_4$ is a fourth transistor that switches, in synchronization with the transistors $T_1$ and $T_2$ and mutually exclusively with the transistor $T_3$, the conductivity state between the drain terminal D4 and the source terminal S4 between being conductive and non-conductive based on a control signal $v_4$ supplied to the gate terminal G4. That is to say, when the transistors $T_1$ and $T_2$ are in the conductive state and the transistor $T_3$ is in the non-conductive state, the transistor $T_4$ is in the conductive state, and when the transistors $T_1$ and $T_2$ are in the non-conductive state and the transistor $T_3$ is in the conductive state, the transistor $T_4$ is in the non-conductive state.

Note that the transistors $T_1$ to 14 may not necessarily be n-type FETs and may alternatively be p-type FETs.

Further, the transistors $T_1$ to 14 may not necessarily be FETs and may be bi-polar transistors.

The inductor $L_1$ is an inductive element that is placed in the third path and connected in series to the transistor 14. In the present embodiment, the inductor $L_1$ is placed between the transistor 14 and the ground. Note that the inductor $L_1$ is placed between the node N1 and the transistor 14.

Note that the switch circuit 20 according to the present embodiment has the configuration that enables a radio frequency signal to be transmitted bi-directionally between the input/output terminal 110 and the input/output terminal 120.

2.2 Functions and Effects of Switch Circuit According to Embodiment 2

The switch circuit 20 according to the present embodiment has the following functions and effects.

Figure 5A:
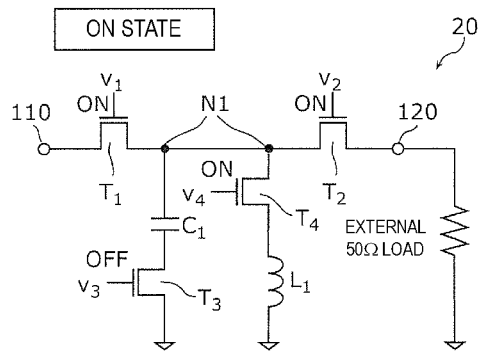
FIGS. 5A and 5B illustrate equivalent circuit diagrams of the switch circuit according to Embodiment 2 in the conductive state.
Figure 5B:
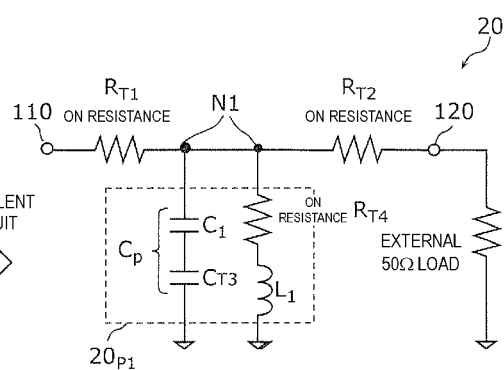

FIGS. 5A and 5B illustrate equivalent circuit diagrams of the switch circuit 20 according to Embodiment 2 in the conductive state. FIG. 5A illustrates a circuit configuration of the switch circuit 20 in the conductive state, and FIG. 5B illustrates an equivalent circuit of the switch circuit 20 in the conductive state. As illustrated in FIG. 5B, the switch circuit 20 in the conductive state is represented by the ON resistance $R_{T1}$ of the transistor $T_1$ in the conductive state, the ON resistance $R_{T2}$ of the transistor $T_2$ in the conductive state, the OFF capacitance $C_{T3}$ of the transistor $T_3$ in the non-conductive state, an ON resistance $R_{T4}$ of the transistor $T_4$ in the conductive state, the capacitor $C_1$, and the inductor $L_1$. At this time, the OFF capacitance $C_{T3}$, the ON resistance $R_{T4}$, the capacitor $C_1$, and the inductor $L_1$ constitute a LC parallel resonant circuit $20_{P1}$. Here, in resonant characteristic analysis of the LC parallel resonant circuit $20_{P1}$, an analysis is performed without considering the ON resistance $R_{T4}$ because the ON resistance $R_{T4}$ has an effect on the Q-factor of the LC parallel resonant circuit $20_{P1}$, but has no effect on the resonant frequency although.

Assuming $C_P$ is a composite capacitance of the LC parallel resonant circuit $20_{P1}$, a resonant frequency $f_{rp}$ of the LC parallel resonant circuit $20_{P1}$ is expressed by the following Equation 1:

[Math. 2]

$$f_{rp} = \frac{1}{2\pi\sqrt{L_1 C_p}} \quad \text{(Equation 1)}$$

Further, the composite capacitance $C_P$ is expressed by the following Equation 2:

[Math. 3]

$$C_p = \frac{C_1 C_{T3}}{C_1 + C_{T3}} \quad \text{(Equation 2)}$$

That is to say, at the resonant frequency $f_{rp}$ that satisfies Equation 1 and Equation 2, the impedance of the LC parallel resonant circuit $20_{P1}$ can be set to a local maximum, and this enables to minimize the loss caused by parasitic capacitance existing between a transmission path and the ground. This enables the switch circuit 20 to maximize the power transmission efficiency for a radio frequency load (50Ω) connected to the input/output terminal 120. This enables to reduce the insertion loss of the switch circuit 20 in the conductive state.

Note that the inductor $L_1$, the capacitor $C_1$, and the OFF capacitance $C_{T3}$ may be determined based on Equation 1 and Equation 2, assuming that a use frequency $f_S$ to be transmitted through the switch circuit 20 is the resonant frequency $f_{rp}$ of Equation 1.

Next, functions and effects of the switch circuit 20 in the non-conductive state are described. When the switch circuit 20 is in the conductive state, because of the placement of the inductor $L_1$ in the third path, there is an effect of enabling the optimization of impedance matching. Whereas, when the switch circuit 20 is in the non-conductive state, not only the placement of the inductor $L_1$ in the third path but also the placement of the transistor $T_4$ is important. The reason is as follows.

Therefore, firstly, there is described an issue regarding Comparative example 3 in which the inductor $L_1$ is placed in the third path but the transistor $T_4$ is not placed therein.

Figure 5C:
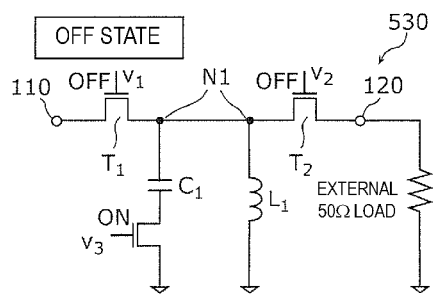
FIGS. 5C, 5D and 5E illustrate equivalent circuit diagrams of a switch circuit according to Comparative example 3 in the non-conductive state.
Figure 5D:
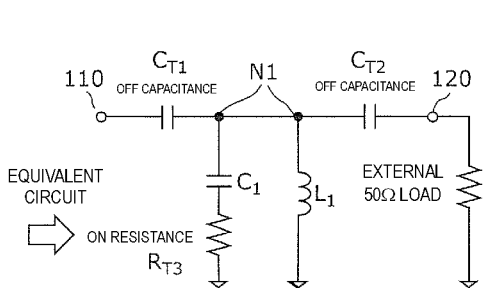
Figure 5E:
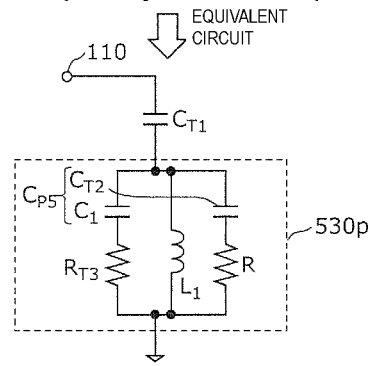

FIGS. 5C, 5D and 5E illustrate equivalent circuit diagrams of a switch circuit 530 according to Comparative example 3 in the non-conductive state. FIG. 5C illustrates a circuit configuration of the switch circuit 530 in the non-conductive state, and FIG. 5D and FIG. 5E illustrate equivalent circuits of the switch circuit 530 in the non-conductive state. The switch circuit 530 according to Comparative example 3 is different from the switch circuit 20 according to Embodiment 2 only in that the transistor $T_4$ is excluded.

The switch circuit 530 according to Comparative example 3 and an external 50Ω load connected to the input/output terminal 120 can be represented by an equivalent circuit illustrated in FIG. 5E. That is to say, the switch circuit 530 including the external 50Ω load is a circuit in which the OFF capacitance $C_{T1}$ and a LC parallel resonant circuit $530_p$ are connected in series. The LC parallel resonant circuit $530_p$ is a circuit in which (1) a series connection circuit of the capacitor $C_1$ and the ON resistance $R_{T3}$, (2) the inductor $L_1$, and (3) a series connection circuit of the OFF capacitance $C_{T2}$ and an external load resistor R are connected in parallel. Here, in resonant characteristic analysis of the LC parallel resonant circuit $530_P$, an analysis is performed without considering the ON resistance $R_{T3}$ and the load resistor R. This is because the ON resistance $R_{T3}$ and the load resistor R have an effect on the Q-factor of the LC parallel resonant circuit $530_P$, but the resonant frequency does not change even if the ON resistance $R_{T3}$ and the load resistor R are ignored. At this time, a resonant frequency $f_{p5}$ of the LC parallel resonant circuit $530_P$ is expressed by the following Equation 3:

[Math. 4]

$$f_{P5} = \frac{1}{2\pi\sqrt{L_1 C_{P5}}} \quad \text{(Equation 3)}$$

Here, depending on the magnitude of $\omega(=2\pi f)$, the LC parallel resonant circuit $530_p$ changes as having positive impedance or negative impedance. That is to say, (1) in the case where $\omega$ is small, the impedance of the LC parallel resonant circuit $530_p$ becomes inductive, and (2) in the case where $\omega$ is large, the impedance of the LC parallel resonant circuit $530_p$ becomes capacitive.

In the case of the foregoing (1), the switch circuit 530 operates as a LC series resonant circuit of the OFF capacitance $C_{T1}$ and the inductive LC parallel resonant circuit $530_p$. In this LC series resonant circuit, the phase of a voltage $V_1$ generated across two end portion of the OFF capacitance $C_{T1}$ and the phase of a voltage $V_{530}$ generated across two end portions of the LC parallel resonant circuit $530_p$ differ by 180 degrees. Further, for a voltage $V_{in}$ of a radio frequency signal applied to the input/output terminal 110 of the switch circuit 530, $V_{in}=V_1+V_{530}$ holds. Thus, at least one of $V_1$ and $V_{530}$ is larger than $V_{in}$.

That is to say, there is a case where the voltage $V_{530}$ generated across the two end portions of the LC parallel resonant circuit $530_p$ becomes larger than the voltage $V_{in}$ of a radio frequency signal applied to the input/output terminal 110. Therefore, there is the risk that the voltage applied to the transistor $T_2$ may exceed an acceptable breakdown voltage value of the transistor $T_2$ and cause a breakdown.

Whereas, in the switch circuit 20 according to the present embodiment, the transistor $T_4$ connected in series to the inductor $L_1$ is placed in the third path.

FIGS. 6A and 6B illustrate equivalent circuit diagrams of the switch circuit 20 according to Embodiment 2 in the non-conductive state. FIG. 6A illustrates a circuit of the switch circuit 20 in the non-conductive state (OFF state), and FIG. 6B illustrates an equivalent circuit of the switch circuit 20 in the non-conductive state including an external 50Ω load connected to the input/output terminal 120.

As illustrated in FIG. 6B, the switch circuit 20 including the external 50Ω load is a circuit in which the OFF capacitance $C_{T1}$ and a LC parallel resonant circuit $20_{p2}$ are connected in series. The LC parallel resonant circuit $20_{p2}$ is a circuit in which (1) a series connection circuit of the capacitor $C_1$ and the ON resistance $R_{T3}$ (Branch 1), (2) a series connection circuit of an OFF capacitance $C_{T4}$ and the inductor $L_1$ (Branch 2), and (3) a series connection circuit of the OFF capacitance $C_{T2}$ and an external load resistor R (Branch 3) are connected in parallel.

Here, a circuit network (equivalent circuit) of the switch circuit 20 illustrated in FIG. 6B is analyzed quantitatively to determine whether this circuit network becomes inductive or capacitive with respect to a change in the angular frequency $\omega$.

First, an impedance $Z_{P21}$ of Branch 1 is expressed by the following Equation 4:

[Math. 5]

$$Z_{P21} = R_{T3} + \frac{1}{j\omega C_1} = \frac{1 + j\omega R_{T3} C_1}{j\omega C_1} \quad \text{(Equation 4)}$$

From Equation 4, the admittance $Y_{P21}$ of Branch 1 is expressed by the following Equation 5:

[Math. 6]

$$Y_{P21} = \frac{1}{Z_{P21}} = \frac{\omega^2 R_{T3}^2 C_1^2}{1 + \omega^2 R_{T3}^2 C_1^2} + j\omega \frac{C_1}{1 + \omega^2 R_{T3}^2 C_1^2} \quad \text{(Equation 5)}$$

Equation 5 can be viewed as an equation for the admittance of a parallel circuit of a capacitor and a resistor. Accordingly, it is considered that Branch 1 is equivalent to a RC parallel circuit that includes, as circuit components, a resistance $R'_{T3}$ and a capacitance $C'_1$ that will be defined in the following Equation 6:

[Math. 7]

$$R'_{T3} = \frac{1 + \omega^2 R_{T3}^2 C_1^2}{\omega^2 R_{T3} C_1^2} \quad \text{(Equation 6)}$$

$$C'_1 = \frac{C_1}{1 + \omega^2 R_{T3}^2 C_1^2}$$

Here, as a typical case to which the switch circuit 20 according to the present embodiment is applied, by substituting a frequency f=1 GHz, $R_{T3}=1\Omega$, and $C_1=1$ pF into Equation 6, $\omega^2 R_{T3}^2 C_1^2 = 10^{-6} \ll 1$ is obtained. Then, the lower part of Equation 6 can be approximated as $C_1' \approx C_1$.

Next, Branch 3 is analyzed in the way similar to the foregoing analysis on Branch 1. As a result, it is considered that Branch 3 is equivalent to a RC parallel circuit that includes, as circuit components, a resistance R' and a capacitance $C'_{T2}$ that will be defined in the following Equation 7:

[Math. 8]

$$R' = \frac{1 + \omega^2 R^2 C_{T2}^2}{\omega^2 R C_{T2}^2} \quad \text{(Equation 7)}$$

$$C'_{T2} = \frac{C_{T2}}{1 + \omega^2 R^2 C_{T2}^2}$$

Again, as a typical case to which the switch circuit 20 according to the present embodiment is applied, substituting frequency f=1 GHz, R=50Ω, and $C_{T2}=1$ pF into Equation 7, $\omega^2 R^2 C_{T2}^2 \ll 1$ is obtained. Then, the lower part of Equation 7 can be approximated as $C_{T2}' \approx C_{T2}$.

FIG. 6C is a equivalent circuit diagram of the LC parallel resonant circuit $20_{p2}$ in the switch circuit 20 according to Embodiment 2. As illustrated in the upper part of FIG. 6C, by the foregoing modification operation of an equivalent circuit of the LC parallel resonant circuit $20_{p2}$, the LC parallel resonant circuit $20_{p2}$ illustrated in FIG. 6B becomes a resonant circuit in which (1) a RC parallel circuit of the capacitor $C_1$ and the resistance $R_{T3}'$ (Branch 1), (2) a series connection circuit of the OFF capacitance $C_{T4}$ and the inductor $L_1$ (Branch 2), and (3) a RC parallel circuit of a capacitor $C_{T2}$ and the resistance R' (Branch 3) are connected in parallel.

In the equivalent circuit of the LC parallel resonant circuit $20_{P2}$ illustrated in the upper part of FIG. 6C, the resistances $R_{T3}'$ and R' degrades only the Q-factor of the resonant circuit but does not have an effect on the resonant frequency. Accordingly, hereinafter, the analysis of the LC parallel resonant circuit $20_{P2}$ is continued while omitting the resistances $R_{T3}'$ and R'. Note that the LC parallel resonant circuit $20_{P2}$, in which the resistances $R_{T3}'$ and R' are omitted, becomes a resonant circuit $20_{P2}'$ illustrated in the lower part of FIG. 6C.

The admittance $Y_P$ of the resonant circuit $20_{P2}'$ is expressed by the following Equation 8:

[Math. 9]

$$Y_P = \frac{j\omega C_{T4}}{1 - \omega^2 L_1 C_{T4}} + j\omega(C_1 + C_{T2}) \quad \text{(Equation 8)}$$
$$= j\omega \frac{(C_1 + C_{T2} + C_{T4}) - \omega^2 L_1 C_{T4}(C_1 + C_{T2})}{1 - \omega^2 L_1 C_{T4}}$$

Here, the angular frequency $\omega_0$ (=$2\pi f_0$) at which the numerator of Equation 8 becomes zero is expressed by the following Equation 9:

[Math. 10]

$$\omega_0 = \sqrt{\frac{C_1 + C_{T2} + C_{T4}}{L_1 C_{T4}(C_1 + C_{T2})}} \quad \text{(Equation 9)}$$

Further, the angular frequency $\omega_\infty$ (=$2\pi f_\infty$) at which the denominator of Equation 8 becomes zero is a pole of the admittance $Y_P$ and expressed by the following Equation 10:

[Math. 11]

$$\omega_\infty = \frac{1}{\sqrt{L_1 C_{T4}}} \quad \text{(Equation 10)}$$

When the angular frequencies $\omega_0$ and $\omega_\infty$ respectively expressed by Equation 9 and Equation 10 are compared, it is clear that $\omega_0 > \omega_\infty$ holds. Further, by differentiating a susceptance B, which is the imaginary part of the admittance $Y_P$, with respect to the angular frequency $\omega$, it is clear that the susceptance B always increases with an increase in the angular frequency $\omega$.

FIG. 6D is a graph illustrating the frequency dependency of the susceptance B of the LC parallel resonant circuit $20_{P2}$ in the switch circuit 20 according to Embodiment 2. The graph of FIG. 6D is prepared based on Equations 8 to Equation 10, $\omega_0 > \omega_\infty$, and the characteristic that the susceptance B always increases with an increase in the angular frequency $\omega$.

In the case where the LC parallel resonant circuit $20_{P2}$ is inductive, the switch circuit 20 operates as a LC series resonant circuit of the OFF capacitance $C_{T2}$ and the LC parallel resonant circuit $20_{p2}$. In this case, the voltage generated across the two end portions of the LC parallel resonant circuit $20_{p2}$ sometimes becomes larger than the voltage of a radio frequency signal applied to the input/output terminal 110. Therefore, there is the risk that the voltage applied to the transistor $T_2$ may exceed an acceptable breakdown voltage value of the transistor $T_2$ and cause a breakdown.

However, in the switch circuit 20 according to the present embodiment, as illustrated in the graph of FIG. 6D, the LC parallel resonant circuit $20_{P2}$ exhibits substantially capacitive property except for the range between the angular frequency $\omega_0$ and the angular frequency $\omega_\infty$ (the value of reactance viewed from the node N1 to the LC parallel resonant circuit $20_{P2}$ becomes negative). Therefore, it becomes possible to avoid the case where the voltage of the node N1 becomes greater than the radio frequency signal voltage. Accordingly, the breakdown voltage capability of the switch circuit 20 in the non-conductive state can be improved.

Note that in the switch circuit 20, it is desirable to reduce the range where the LC parallel resonant circuit $20_{P2}$ exhibits the inductive property as much as possible. In view of this, the following configurations are preferable:

(1) Sufficiently increase the angular frequency $\omega_\infty$, from which the switch circuit 20 starts to become inductive, with respect to a use angular frequency $\omega_S$ (=$2\pi f_S$) of the switch circuit 20. Here, the use angular frequency $\omega_S$ is defined as the angular frequency of a radio frequency signal that transmits through the switch circuit 20.

(2) Reduce the difference between the angular frequency $\omega_\infty$ and the angular frequency $\omega_0$.

One of the measures for the foregoing (1) is to set the angular frequency $\omega_\infty$ equal to ten times the use angular frequency $\omega_S$ or higher. That is to say, $\omega_\infty \geq 10 \times \omega_S$, and it is desirable to set the OFF capacitance $C_{T4}$ of the transistor $T_4$ in such a way that Equation 11, which is obtained by expanding $\omega_\infty \geq 10 \times \omega_S$, holds.

[Math. 12]

$$\frac{1}{2\pi\sqrt{L_1 C_{T4}}} \geq 10 \cdot f_S \quad \text{(Equation 11)}$$

According of this, the frequency range which makes the LC parallel resonant circuit $20_{P2}$ inductive becomes a radio frequency range whose frequencies are equal to or more than ten times the use frequency $f_S$ of the switch circuit 20. Therefore, in the use frequency $f_S$, the LC parallel resonant circuit $20_{P2}$ can always maintain the capacitive property, and this enables to avoid the case where the voltage of the node N1 becomes a voltage greater than the radio frequency signal voltage. Accordingly, it becomes possible to effectively improve the breakdown voltage capability of the switch circuit 20 at the use frequency $f_S$.

Further, with regard to the foregoing (2), from Equation 9 and Equation 10, $\omega_0/\omega_\infty$ is expressed by the following Equation 12:

[Math. 13]

$$\frac{\omega_0}{\omega_\infty} = \sqrt{1 + \frac{C_{T4}}{C_1 + C_{T2}}}$$ (Equation 12)

In order to achieve the foregoing (2), it is only necessary to bring $\omega_0/\omega_\infty$ of Equation 12 close to 1, and therefore it is only necessary to reduce the OFF capacitance $C_{T4}$ of the transistor $T_4$.

2.3 Mounting Form of Switch Circuit According to Embodiment 2

The switch circuit 20 according to the present embodiment is formed in a single switch IC. That is to say, the input/output terminals 110 and 120, the transistors $T_1$ to $T_4$, the capacitor $C_1$, and the inductor $L_1$ are formed in a single switch IC.

The switch IC is, for example, an integrated circuit including the switch circuit 20 according to the present embodiment and a control circuit. The control circuit is, for example, a digital control circuit and supplies a control signal to the switch circuit 20 via a control wiring line for switching the conductivity state between the input/output terminals 110 and 120 in the switch circuit 20 between being conductive and non-conductive, based on a power supply signal, an IO signal, a clock signal, a data signal, and the like, which are supplied from the RF signal processing circuit (RFIC) or the like. Note that the control circuit may further include a function of supplying a control signal to an amplifier for adjusting an amplification factor of the amplifier.

The foregoing configuration facilitates the mounting of the switch circuit 20 on a mounting substrate or the like. Further, this enables to shorten wiring lines inside the switch circuit 20, and thus the transmission loss caused by the wiring lines can be reduced.

Note that the inductor $L_1$ that constitutes the switch circuit 20 may be formed outside the switch IC.

Figure 7:
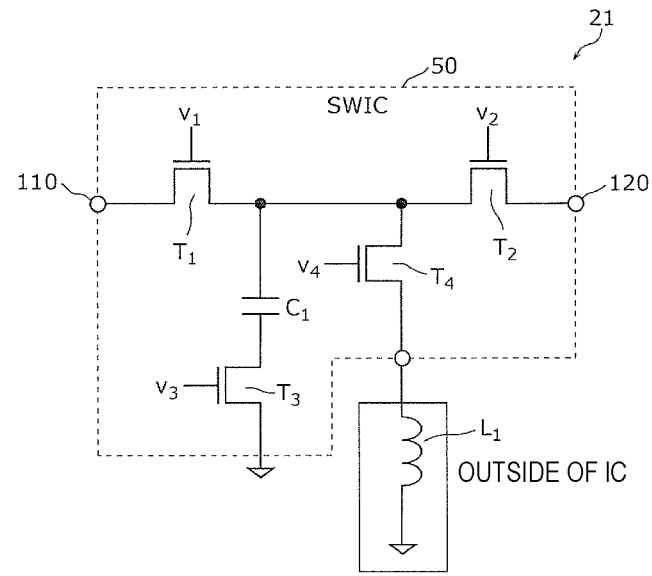
FIG. 7 is a circuit configuration diagram of a switch circuit according to a modified example of Embodiment 2.

FIG. 7 is a circuit configuration diagram of a switch circuit 21 according to a modified example of Embodiment 2. Compared with the switch circuit 20 according to Embodiment 2, the switch circuit 21 illustrated in FIG. 7 shares the same circuit elements and the same connection configuration thereof and is different only in that the inductor $L_1$ is formed outside the switch IC 50. That is to say, the input/output terminals 110 and 120, the transistors $T_1$ to $T_4$, and the capacitor $C_1$ are formed in the single switch IC 50, and the inductor $L_1$ is formed outside the switch IC 50.

According to the configuration of the present modified example, the inductor $L_1$ can be appropriately changed according to impedance matching with a radio frequency load connected to the switch circuit 21, the number of signal paths connected to the switch circuit 21, and the like, thereby improving flexibility in designing the switch circuit.

Embodiment 3

In the present embodiment, a configuration of a multiport switch in which a plurality of SPST type switch circuits according to Embodiment 1 or 2 are combined is illustrated.

Figure 8:
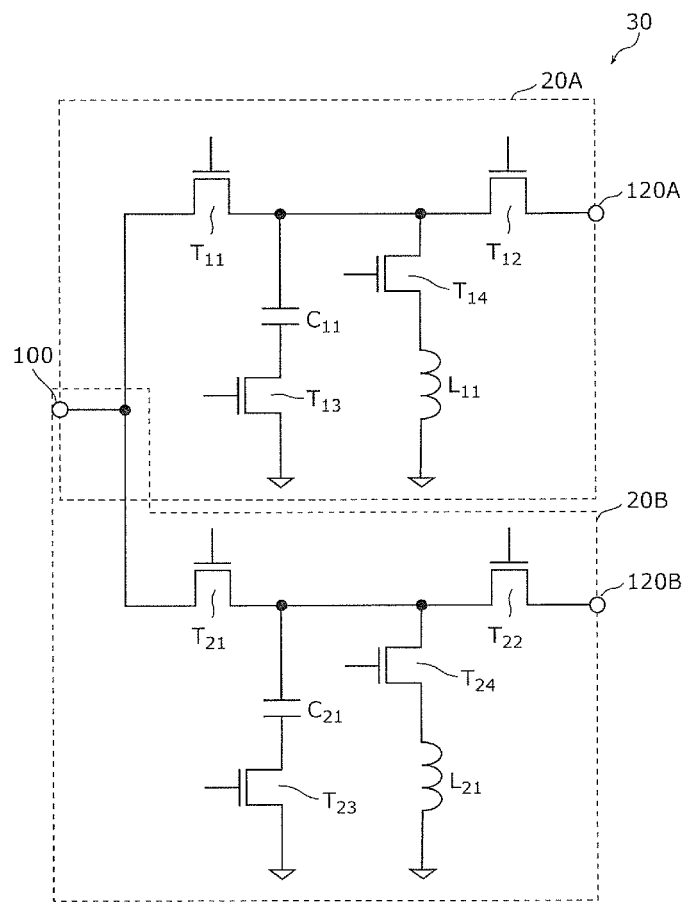
FIG. 8 is a circuit configuration diagram of a switch circuit according to Embodiment 3.

FIG. 8 is a circuit configuration diagram of a switch circuit 30 according to Embodiment 3. As illustrated in FIG. 8, the switch circuit 30 includes a common terminal 100, selection terminals 120A and 120B, and switch units 20A and 20B.

The switch circuit 20A is a first switch unit including a switch circuit 20 according to Embodiment 2. The switch circuit 20B is a second switch unit including a switch circuit 20 according to Embodiment 2.

The common terminal 100 functions as one of two input/output terminals included in the switch unit 20A and further functions as one of two input/output terminals included in the switch unit 20B.

The selection terminal 120A (first selection terminal) functions as the other input/output terminal of the switch unit 20A, and the selection terminal 120B (second selection terminal) functions as the other input/output terminal of the switch unit 20B.

Note that the switch unit 20A may alternatively include a switch circuit 10 according to Embodiment 1 or a switch circuit 21 according to the modified example of Embodiment 2, and similarly, the switch unit 20B may alternatively include a switch circuit 10 according to Embodiment 1 or a switch circuit 21 according to the modified example of Embodiment 2.

The foregoing configuration enables the switch circuit 30 to switch the conductivity state between the common terminal 100 and the selection terminal 120A between being conductive and non-conductive and to switch the conductivity state between the common terminal 100 and the selection terminal 120B between being conductive and non-conductive. Note that the switching of the conductivity state between the common terminal 100 and the selection terminal 120A between being conductive and non-conductive and the switching of the conductivity state between the common terminal 100 and the selection terminal 120B between being conductive and non-conductive can be performed independently, mutually exclusively, or in synchronization.

Because the switch units 20A and 20B each have the configuration of the switch circuit according to Embodiment 1 or 2, it becomes possible to provide a single pole double throw (SPDT) type switch circuit 30 with improved breakdown voltage capability while maintaining low loss property.

Figure 9:
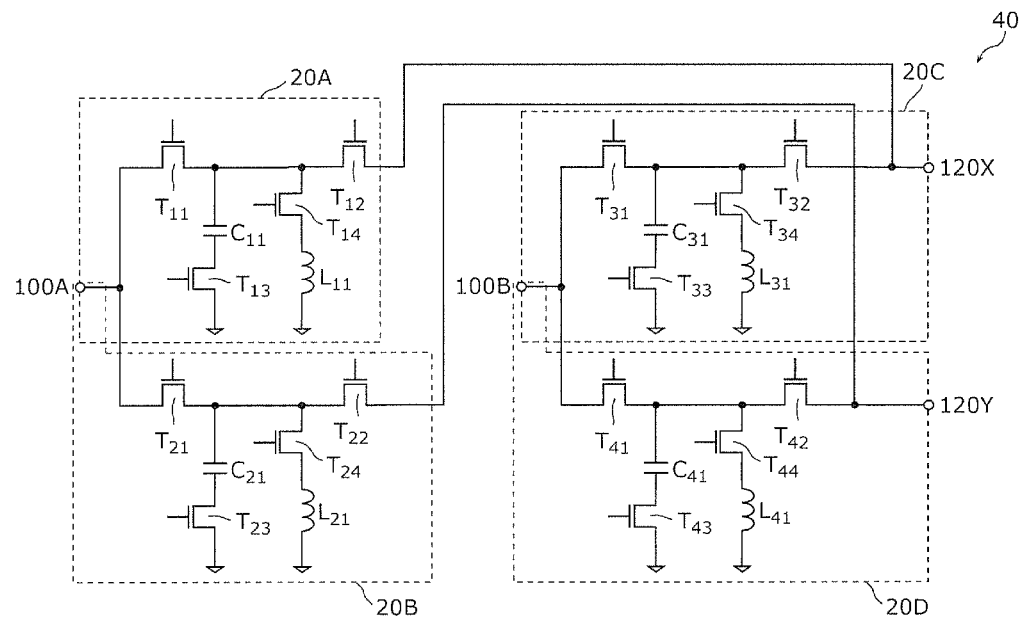
FIG. 9 is a circuit configuration diagram of a switch circuit according to a modified example of Embodiment 3.

FIG. 9 is a circuit configuration diagram of a switch circuit 40 according to a modified example of Embodiment 3. As illustrated in FIG. 9, the switch circuit 40 includes common terminals 100A and 100B, selection terminals 120X and 120Y, and switch units 20A, 20B, 20C, and 20D.

The switch circuit 20A is a first switch unit including a switch circuit 20 according to Embodiment 2. The switch circuit 20B is a second switch unit including a switch circuit 20 according to Embodiment 2. The switch circuit 20C is a third switch unit including a switch circuit 20 according to Embodiment 2. The switch circuit 20D is a fourth switch unit including a switch circuit 20 according to Embodiment 2.

The common terminal 100A (first common terminal) functions as one of two input/output terminals included in the switch unit 20A and further functions as one of two input/output terminals included in the switch unit 20B. The common terminal 100B (second common terminal) functions as one of two input/output terminals included in the switch unit 20C and further functions as one of two input/output terminals included in the switch unit 20D.

The selection terminal 120X (first selection terminal) functions as the other input/output terminal of the switch unit 20A and further functions as the other input/output terminal of the switch unit 20C. The selection terminal 120Y (second selection terminal) functions as the other input/output terminal of the switch unit 20B and further functions as the other input/output terminal of the switch unit 20D.

Note that the switch unit 20A may alternatively include a switch circuit 10 according to Embodiment 1 or a switch circuit 21 according to the modified example of Embodiment 2, and that the switch unit 20B may alternatively include a switch circuit 10 according to Embodiment 1 or a switch circuit 21 according to the modified example of Embodiment 2. Further, the switch unit 20C may alternatively include a switch circuit 10 according to Embodiment 1 or a switch circuit 21 according to the modified example of Embodiment 2, and the switch unit 20D may alternatively include a switch circuit 10 according to Embodiment 1 or a switch circuit 21 according to the modified example of Embodiment 2.

The foregoing configuration enables the switch circuit 40 to switch the conductivity state between the common terminal 100A and the selection terminal 120X between being conductive and non-conductive and to switch the conductivity state between the common terminal 100A and the selection terminal 120Y between being conductive and non-conductive. Note that the switching of the conductivity state between the common terminal 100A and the selection terminal 120X between being conductive and non-conductive and the switching of the conductivity state between the common terminal 100A and the selection terminal 120Y between being conductive and non-conductive can be performed independently, mutually exclusively, or in synchronization. Further, it becomes possible for the switch circuit 40 to switch the conductivity state between the common terminal 100B and the selection terminal 120X between being conductive and non-conductive and to switch the conductivity state between the common terminal 100B and the selection terminal 120Y between being conductive and non-conductive. Note that the switching of the conductivity state between the common terminal 100B and the selection terminal 120X between being conductive and non-conductive and the switching of the conductivity state between the common terminal 100B and the selection terminal 120Y between being conductive and non-conductive can be performed independently, mutually exclusively, or in synchronization.

Because the switch units 20A to 20D each have the configuration of the switch circuit according to Embodiment 1 or 2, it becomes possible to provide a double pole double throw (DPDT) type switch circuit 40 with improved breakdown voltage capability while maintaining low loss property.

Note that by combining switch circuits according to Embodiment 1 or 2 in a composite manner, it become possible to configure not only the SPDT type switch circuit and the DPDT type switch circuit described above, but also a switch circuit of SPxT (x is a natural number equal to or larger than 3) type and a switch circuit of yPxT (x is a natural number equal to or larger than 3 and y is a natural number equal to or larger than 2) type.

Embodiment 4

The switch circuits described in Embodiments 1 to 3 can be applied to a radio frequency front-end circuit and a communication device, each of which can handle a multi-band system. Therefore, in the present embodiment, such a radio frequency front-end circuit and such a communication device are described.

Figure 10:
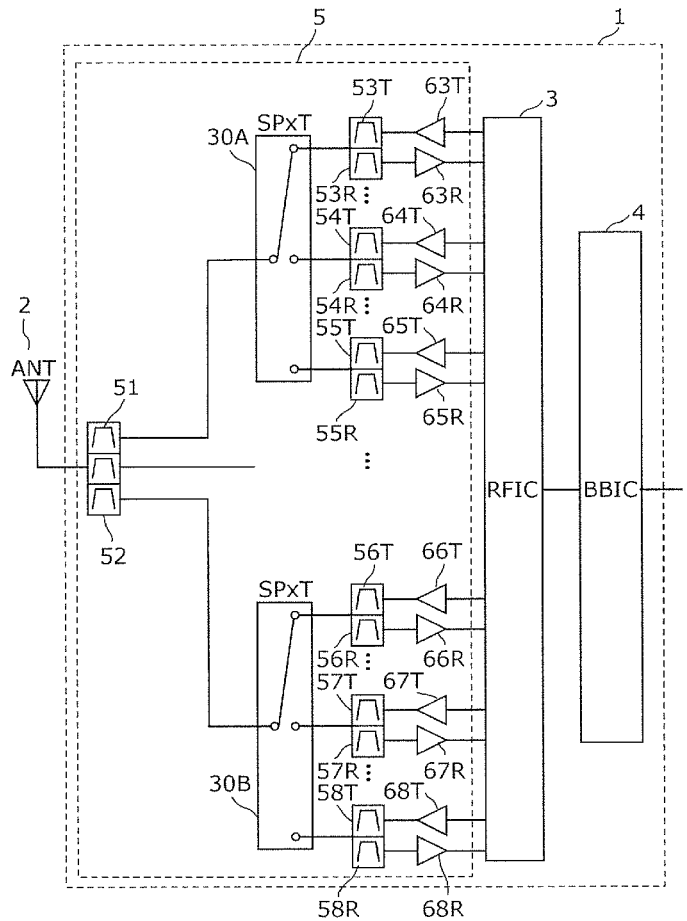
FIG. 10 is a block configuration diagram of a communication device and peripheral circuits according to Embodiment 4.

FIG. 10 is a block configuration diagram of a communication device 1 and peripheral circuits according to Embodiment 4. FIG. 10 illustrates the communication device 1 and an antenna 2 connected to the communication device 1. As illustrated in FIG. 10, the communication device 1 includes a radio frequency front-end circuit 5, a RF signal processing circuit (RFIC) 3, and a base band signal processing circuit (BBIC) 4.

The radio frequency front-end circuit 5 includes switch circuits 30A and 30B, filters 51, 52, 53T, 53R, 54T, 54R, 55T, 55R, 56T, 56R, 57T, 57R, 58T, and 58R, transmission amplifiers 63T, 64T, 65T, 66T, 67T, and 68T, and reception amplifiers 63R, 64R, 65R, 66R, 67R, and 68R. The radio frequency front-end circuit 5 is a front-end circuit that de-multiplexes a radio frequency signal received by an antenna element 2 and multiplexes radio frequency signals outputted from the RFIC 3.

The filters 51 and 52 are connected to the antenna 2 and constitute a multiplexer. The filter 51 is, for example, a filter that passes radio frequency signals of a plurality of communication bands belonging to a low band group, and the filter 52 is, for example, a filter that passes radio frequency signals of a plurality of communication bands belonging to a high band group.

Note that FIG. 10 also illustrates a filter that passes radio frequency signals of communication bands belonging to a middle band group between the filter 51 and the filter 52. However, this filter is not an essential constituting element for the radio frequency front-end circuit 5 according to the present embodiment. In the case where there is no filter that passes radio frequency signals of communication bands belonging to the middle band group, the filters 51 and 52 constitute a diplexer.

The filter 53T is connected to the switch circuit 30A and the transmission amplifier 63T and is, for example, a transmission filter whose pass band is Band A1 belonging to the low band group. The filter 53R is connected to the switch circuit 30A and the reception amplifier 63R and is, for example, a reception filter whose pass band is Band A1 belonging to the low band group. The filter 54T is connected to the switch circuit 30A and the transmission amplifier 64T and is, for example, a transmission filter whose pass band is Band B1 belonging to the low band group. The filter 54R is connected to the switch circuit 30A and the reception amplifier 64R and is, for example, a reception filter whose pass band is Band B1 belonging to the low band group. The filter 55T is connected to the switch circuit 30A and the transmission amplifier 65T and is, for example, a transmission filter whose pass band is Band C1 belonging to the low band group. The filter 55R is connected to the switch circuit 30A and the reception amplifier 65R and is, for example, a reception filter whose pass band is Band C1 belonging to the low band group.

The filter 56T is connected to the switch circuit 30B and the transmission amplifier 66T and is, for example, a transmission filter whose pass band is Band D1 belonging to the high band group. The filter 56R is connected to the switch circuit 30B and the reception amplifier 66R and is, for example, a reception filter whose pass band is Band D1 belonging to the high band group. The filter 57T is connected to the switch circuit 30B and the transmission amplifier 67T and is, for example, a transmission filter whose pass band is Band E1 belonging to the high band group. The filter 57R is connected to the switch circuit 30B and the reception amplifier 67R and is, for example, a reception filter whose pass band is Band E1 belonging to the high band group. The filter 58T is connected to the switch circuit 30B and the transmission amplifier 68T and is, for example, a transmission filter whose pass band is Band F1 belonging to the high band group. The filter 58R is connected to the switch circuit 30B and the reception amplifier 68R and is, for example, a reception filter whose pass band is Band F1 belonging to the high band group.

The filters 53T and 53R form a duplexer for Band A1 and also form a signal path of Band A1 together with the transmission amplifier 63T and the reception amplifier 63R. The filters 54T and 54R form a duplexer for Band B1 and also form a signal path of Band B1 together with the transmission amplifier 64T and the reception amplifier 64R. The filters 55T and 55R form a duplexer for Band C1 and also form a signal path of Band C1 together with the transmission amplifier 65T and the reception amplifier 65R. The filters 56T and 56R form a duplexer for Band D1 and also form a signal path of Band D1 together with the transmission amplifier 66T and the reception amplifier 66R. The filters 57T and 57R form a duplexer for Band E1 and also form a signal path of Band E1 together with the transmission amplifier 67T and the reception amplifier 67R. The filters 58T and 58R form a duplexer for Band F1 and also form a signal path of Band F1 together with the transmission amplifier 68T and the reception amplifier 68R.

The switch circuit 30A is a SPxT (x is a natural number equal to or larger than 3) type switch circuit and is formed by combining a plurality of switch circuits according to Embodiment 1 or 2. In the switch circuit 30A, the common terminal is connected to the filter 51, and each selection terminal is connected to one of the signal paths of Band A1, Band B1, and Band C1. The switch circuit 30A switches the conductivity state between the antenna 2 and the signal paths of Bands A1, B1, and C1 between being conductive and non-conductive.

The switch circuit 30B is a SPxT (x is a natural number equal to or larger than 3) type switch circuit and is formed by combining a plurality of switch circuits according to Embodiment 1 or 2. In the switch circuit 30B, the common terminal is connected to the filter 52, and each selection terminal is connected to one of the signal paths of Band D1, Band E1, and Band F1. The switch circuit 30B switches the conductivity state between the antenna 2 and the signal paths of Bands D1, E1, and F1 between being conductive and non-conductive.

Note that in the radio frequency front-end circuit 5, in addition to the foregoing configuration, circuit elements such as an impedance matching circuit, a phase shifter, a circulator, and the like may be arranged.

Further, the communication bands to be set in the radio frequency front-end circuit 5 are not limited to the six bands described above. Further, depending on the number of bands, the number of the selection terminals of the switch circuits 30A and 30B changes.

The foregoing configuration enables the radio frequency front-end circuit 5 to transmit a radio frequency signal of one band selected from the group of Bands A1, B1, and C1 belonging to the low band group and to transmit a radio frequency signal of one band selected from the group of Bands D1, E1, and F1 belonging to the high band group. Further, the foregoing configuration also enables the radio frequency front-end circuit 5 to simultaneously transmit a radio frequency signal of one band selected from the bands belonging to the low band group and a radio frequency signal of one band selected from the bands belonging to the high band group. Because the switch units 30A and 30B are formed by combining a plurality of switch circuits according to Embodiment 1 or 2, it becomes possible to provide the radio frequency front-end circuit 5 with improved breakdown voltage capability while maintaining low loss property.

The RFIC 3 is a circuit that performs processing of radio frequency signals being transmitted or received by the antenna 2. Specifically, the RFIC 3 performs signal processing on a radio frequency signal (here, a radio frequency reception signal) inputted from the antenna 2 via a reception side signal path using down-converting and the like, and outputs a reception signal generated by this signal processing to the BBIC 4. Further, the RFIC 3 performs signal processing on a transmission signal inputted from the BBIC 4 using up-converting and the like, and outputs a radio frequency signal (here, a radio frequency transmission signal) generated by this signal processing to a transmission side signal path. Note that the RFIC 3 may include a control unit (control circuit) that outputs a control signal for controlling switch operations of the switch circuits 30A and 30B.

According to the foregoing configuration, it becomes possible to provide the communication device 1 with improved breakdown voltage capability while maintaining low loss property.

Note that in the radio frequency front-end circuit 5 according to the foregoing embodiment, the SPxT type switch circuit is applied. However, the radio frequency front-end circuit 5 may be a radio frequency front-end circuit to which a DPDT type switch circuit is applied.

Figure 11:
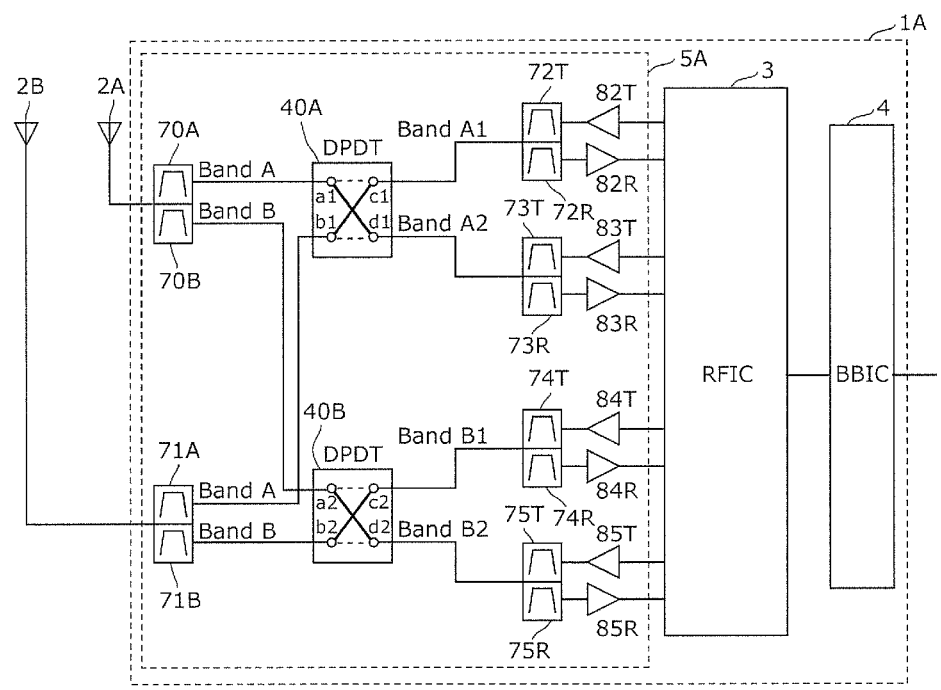
FIG. 11 is a block configuration diagram of a communication device and peripheral circuits according to a modified example of Embodiment 4.

FIG. 11 is a block configuration diagram of a communication device 1A and peripheral circuits according to a modified example of Embodiment 4. FIG. 11 illustrates a communication device 1A and antennas 2A and 2B connected to the communication device 1A. As illustrated in FIG. 11, the communication device 1A includes a radio frequency front-end circuit 5A, the RFIC 3, and the BBIC 4.

The radio frequency front-end circuit 5A includes switch circuits 40A and 40B, filters 70A, 70B, 71A, 71B, 72T, 72R, 73T, 73R, 74T, 74R, 75T, and 75R, transmission amplifiers 82T, 83T, 84T, and 85T, and reception amplifiers 82R, 83R, 84R, and 85R. The radio frequency front-end circuit 5A is a front-end circuit that de-multiplexes radio frequency signals received by the antenna elements 2A and 2B and multiplexes radio frequency signals outputted from the RFIC 3.

The filters 70A and 70B are connected to the antenna 2A and constitute a first diplexer that de-multiplexes or multiplexes a radio frequency signal of Band A and a radio frequency signal of Band B. The filters 71A and 71B are connected to the antenna 2B and constitute a second diplexer that de-multiplexes or multiplexes a radio frequency signal of Band A and a radio frequency signal of Band B.

The filter 72T is connected to the switch circuit 40A and the transmission amplifier 82T and is, for example, a transmission filter whose pass band is Band A1 belonging to Band A. The filter 72R is connected to the switch circuit 40A and the reception amplifier 82R and is, for example, a reception filter whose pass band is Band A1 belonging to Band A. The filter 73T is connected to the switch circuit 40A and the transmission amplifier 83T and is, for example, a transmission filter whose pass band is Band A2 belonging to Band A. The filter 73R is connected to the switch circuit 40A and the reception amplifier 83R and is, for example, a reception filter whose pass band is Band A2 belonging to Band A.

The filter 74T is connected to the switch circuit 40B and the transmission amplifier 84T and is, for example, a transmission filter whose pass band is Band B1 belonging to Band B. The filter 74R is connected to the switch circuit 40B and the reception amplifier 84R and is, for example, a reception filter whose pass band is Band B1 belonging to Band B. The filter 75T is connected to the switch circuit 40B and the transmission amplifier 85T and is, for example, a transmission filter whose pass band is Band B2 belonging to Band B. The filter 75R is connected to the switch circuit 40B and the reception amplifier 85R and is, for example, a reception filter whose pass band is Band B2 belonging to Band B.

The filters 72T and 72R form a duplexer for Band A1 and also form a signal path of Band A1 together with the transmission amplifier 82T and the reception amplifier 82R. The filters 73T and 73R form a duplexer for Band A2 and also form a signal path of Band A2 together with the transmission amplifier 83T and the reception amplifier 83R. The filters 74T and 74R form a duplexer for Band B1 and also form a signal path of Band B1 together with the transmission amplifier 84T and the reception amplifier 84R. The filters 75T and 75R form a duplexer for Band B2 and also form a signal path of Band B2 together with the transmission amplifier 85T and the reception amplifier 85R.

The switch circuit 40A is a DPDT type switch circuit to which the switch circuit 40 according to the modified example of Embodiment 3 is applied. In the switch circuit 40A, a common terminal a1 is connected to the filter 70A, a common terminal b1 is connected to the filter 71A, a selection terminal c1 is connected to a signal path of Band A1, and a selection terminal d1 is connected to a signal path of Band A2. The switch circuit 40A has a function of sorting radio frequency signals of Bands A1 and A2 into the antennas 2A and 2B. For example, in the case where the antenna 2A is a main antenna and the antenna 2B is a diversity antenna, the main antenna is used for transmitting and receiving one of Bands A1 and A2, and the diversity antenna is used for transmitting and receiving the other of Bands A1 and A2.

The switch circuit 40B is a DPDT type switch circuit to which the switch circuit 40 according to the modified example of Embodiment 3 is applied. In the switch circuit 40B, a common terminal a2 is connected to the filter 70B, a common terminal b2 is connected to the filter 71B, a selection terminal c2 is connected to a signal path of Band B1, and a selection terminal d2 is connected to a signal path of Band B2. The switch circuit 40B has a function of sorting radio frequency signals of Bands B1 and B2 into the antennas 2A and 2B. For example, in the case where the antenna 2A is a main antenna and the antenna 2B is a diversity antenna, the main antenna is used for transmitting and receiving one of Bands B1 and B2, and the diversity antenna is used for transmitting and receiving the other of Bands B1 and B2.

Note that in the radio frequency front-end circuit 5A, in addition to the foregoing configuration, circuit elements such as an impedance matching circuit, a phase shifter, a circulator, and the like may be arranged.

Further, the communication bands to be set in the radio frequency front-end circuit 5A are not limited to the four bands described above. Further, depending on the number of bands, the number of the selection terminals of the switch circuits 40A and 40B changes.

The foregoing configuration enables the radio frequency front-end circuit 5A to transmit and receive a radio frequency signal of one of Bands A1 and A2 using the antenna 2A and to transmit and receive a radio frequency signal of the other of Bands A1 and A2 using the antenna 2B. Alternatively, the foregoing configuration enables the radio frequency front-end circuit 5A to transmit and receive a radio frequency signal of one of Bands B1 and B2 using the antenna 2A and to transmit and receive a radio frequency signal of the other of Bands B1 and B2 using the antenna 2B. Alternatively, a radio frequency signal of Band A and a radio frequency signal of Band B can be transmitted simultaneously. Because the switch units 40A and 40B are each formed of the switch circuit 40 according to the modified example of Embodiment 3, it becomes possible to provide the radio frequency front-end circuit 5A with improved breakdown voltage capability while maintaining low loss property. Further, according to the foregoing configuration, it becomes possible to provide the communication device 1A with improved breakdown voltage capability while maintaining low loss property.

Other Embodiments

The switch circuits, the radio frequency front-end circuits, and the communication devices according to the embodiments of the present disclosure are described using Embodiments 1 to 4. However, the switch circuit, the radio frequency front-end circuit, and the communication device according to the present disclosure are not limited to the foregoing embodiments. Other embodiments realized by combining arbitrary constituting elements of the foregoing embodiments, modified examples obtained by applying various modifications apparent to those skilled in the art to the foregoing embodiments without departing the scope of the present disclosure, and various devices incorporating the switch circuits, the radio frequency front-end circuits, and the communication devices of the present disclosure may also be included in the present disclosure.

Note that in the switch circuits, the radio frequency front-end circuits, and the communication devices according to the foregoing embodiments, another radio frequency circuit element, wiring, or the like may be inserted in a path connecting a circuit element and a signal path disclosed in the drawings.

The present disclosure can be widely used for communication equipment as a switch circuit, a radio frequency front-end circuit, and a communication device, each having low loss and high breakdown voltage.

1, 1A Communication device
2, 2A, 2B Antenna
3 RF signal processing circuit (RFIC)
4 Base band signal processing circuit (BBIC)
5, 5A Radio frequency front-end circuit
10, 20, 21, 30, 30A, 30B, 40, 40A, 40B, 510, 520, 530 Switch circuit
20A, 20B, 20C, 20D Switch unit
$20_{p1}$, $20_{p2}$, $530_p$ LC parallel resonant circuit
$20_{p2}'$ Resonant circuit
50 Switch IC
51, 52, 53R, 53T, 54R, 54T, 55R, 55T, 56R, 56T, 57R, 57T, 58R, 58T, 70A, 70B, 71A, 71B, 72R, 72T, 73R, 73T, 74R, 74T, 75R, 75T Filter
63R, 64R, 65R, 66R, 67R, 68R, 82R, 83R, 84R, 85R Reception amplifier
63T, 64T, 65T, 66T, 67T, 68T, 82T, 83T, 84T, 85T Transmission amplifier
100, 100A, 100B Common terminal
110, 120 Input/output terminal
120A, 120B, 120X, 120Y Selection terminal
$C_1$ Capacitor
D1, D2, D3, D4 Drain terminal
G1, G2, G3, G4 Gate terminal
$L_1$ Inductor N1 Node
S1, S2, S3, S4 Source terminal
$T_1, T_2, T_3, T_4$ Transistor
$v_1, v_2, v_3, v_4$ Control signal

The invention claimed is:
1. A switch circuit comprising:
a first input/output terminal connected to a first radio frequency load;
a second input/output terminal connected to a second radio frequency load, the first input/output terminal being connected to the second input/output terminal by a first path;
a first transistor having a first terminal, a second terminal, and a first control terminal, the first terminal being connected to the first input/output terminal, the second terminal being connected to a first node on the first path, and the first transistor being configured to selectively switch between a conductive state and a non-conductive state based on a first control signal supplied to the first control terminal;
a second transistor having a third terminal, a fourth terminal, and a second control terminal, the fourth terminal being connected to the second input/output terminal, the third terminal being connected to the first node, and the second transistor being configured to selectively switch between a conductive state and a non-conductive state in synchronization with the first transistor;
a third transistor having a fifth terminal, a sixth terminal, and a third control terminal, the fifth terminal and the sixth terminal being connected to a second path connecting the first node and ground, the third transistor being configured to selectively switch between a conductive state and a non-conductive state mutually exclusively with the first transistor and the second transistor;
a fourth transistor having a seventh terminal, an eighth terminal, and a fourth control terminal, the seventh terminal and the eighth terminal being connected to a third path connecting the first node and ground, the third path being different from the second path, and the fourth transistor being configured to selectively switch between a conductive state and a non-conductive state in synchronization with the first transistor and the second transistor;
an inductive element in the third path, the inductive element being connected in series with the fourth transistor; and
a capacitive element in the second path, the capacitive element being connected in series with the third transistor.

2. The switch circuit according to claim 1, wherein:
(1) a series connection of the capacitive element and the third transistor, (2) a series connection of the fourth transistor and the inductive element, and (3) a series connection of the second transistor and the radio frequency load connected to the second input/output terminal, connected in parallel with each other, comprise a circuit, and
when the first transistor, the second transistor, and the fourth transistor are in the non-conductive state, and when the third transistor is in the conductive state, a reactance of the circuit as viewed from the first node is negative.

3. The switch circuit according to claim 1, wherein
a capacitance of the fourth transistor when the fourth transistor is in the non-conductive state has a value that satisfies a relationship expressed by:

$$\frac{1}{2\pi\sqrt{L_1 C_{T4}}} \geq 10 \cdot f_S$$

where L1 is an inductance of the inductive element, CT4 is the capacitance of the fourth transistor when the fourth transistor is in the non-conductive state, and fS is a frequency of a radio frequency signal transmitted through the switch circuit.

4. The switch circuit according to claim 1, wherein the first input/output terminal, the second input/output terminal, the first transistor, the second transistor, the third transistor, the fourth transistor, the capacitive element, and the inductive element are in a single switch integrated circuit.

5. The switch circuit according to claim 1, wherein the first input/output terminal, the second input/output terminal, the first transistor, the second transistor, the third transistor, the fourth transistor, and the capacitive element are in a single switch integrated circuit (IC), and the inductive element is outside the switch IC.

6. A switch system comprising:
a common terminal;
first and second selection terminals;
first and second switches, each comprising the switch circuit according to claim 1, wherein:
the common terminal is the first input/output terminal of the first switch and is the first input/output terminal of the second switch,
the first selection terminal is the second input/output terminal of the first switch, and
the second selection terminal is the second input/output terminal of the second switch.

7. A switch system comprising:
a first common terminal and a second common terminal;
a first selection terminal and a second selection terminal;
first, second, third, and fourth switches, each comprising the switch circuit according to claim 1,
wherein:
the first common terminal is the first input/output terminal of the first switch and is the first input/output terminal of the second switch,
the second common terminal is the first input/output terminal of the third switch and is the first input/output terminal of the fourth switch,
the first selection terminal is the second input/output terminal of the first switch and is the second input/output terminal of the third switch, and
the second selection terminal is the second input/output terminal of the second switch and is the second input/output terminal of the fourth switch.

8. A radio frequency front-end circuit comprising:
the switch circuit according to claim 1;
a plurality of filters connected to the switch circuit; and
a plurality of amplifier circuits respectively connected to the plurality of filters.

9. A communication device comprising:
a radio frequency (RF) signal processing circuit configured to process a radio frequency signal that is transmitted or received by an antenna; and the radio frequency front-end circuit according to claim 8 configured to transmit the radio frequency signal between the antenna and the RF signal processing circuit.

* * * * *